United States Patent
den Besten (10) Patent No.: US 10,284,180 B2
(45) Date of Patent: May 7, 2019

(54) CIRCUITS FOR CORRECTION OF SIGNALS SUSCEPTIBLE TO BASELINE WANDER

(71) Applicant: NXP B.V., Eindhoven (NL)

(72) Inventor: Gerrit Willem den Besten, Eindhoven (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 15/619,222

(22) Filed: Jun. 9, 2017

(65) Prior Publication Data

US 2018/0358953 A1    Dec. 13, 2018

(51) Int. Cl.
| | | |
|---|---|---|
| *H03H 17/02* | (2006.01) | |
| *H04L 25/03* | (2006.01) | |
| *H04L 25/06* | (2006.01) | |
| *H03L 7/08* | (2006.01) | |
| *H04B 1/10* | (2006.01) | |
| *H04B 1/16* | (2006.01) | |

(52) U.S. Cl.
CPC ....... *H03H 17/0219* (2013.01); *H03L 7/0807* (2013.01); *H04B 1/1036* (2013.01); *H04B 1/16* (2013.01); *H04L 25/03012* (2013.01); *H04L 25/061* (2013.01); *H04L 2025/0349* (2013.01)

(58) Field of Classification Search
CPC .................................................. H03H 17/0219
USPC .......................................................... 375/316
See application file for complete search history.

(56) References Cited

U.S. PATENT DOCUMENTS

| | | | | |
|---|---|---|---|---|
| 5,015,934 | A * | 5/1991 | Holley | G05B 19/33 |
| | | | | 250/203.6 |
| 5,699,386 | A * | 12/1997 | Measor | H04L 25/061 |
| | | | | 375/286 |
| 6,038,266 | A | 3/2000 | Lee et al. | |
| 6,239,843 | B1 * | 5/2001 | Gaudreau | H04N 5/211 |
| | | | | 348/461 |
| 7,330,514 | B1 * | 2/2008 | Ahmad | H04B 3/32 |
| | | | | 375/257 |
| 2003/0107831 | A1 | 6/2003 | Erden et al. | |
| 2007/0086615 | A1 * | 4/2007 | Cheney | H04R 1/345 |
| | | | | 381/338 |
| 2007/0153889 | A1 * | 7/2007 | Norton, Jr. | H04L 25/03038 |
| | | | | 375/232 |
| 2012/0155528 | A1 * | 6/2012 | Zhong | A61B 5/7225 |
| | | | | 375/232 |

OTHER PUBLICATIONS

Efficient Digital Baseline Wander Algorithm and its Architecture for Fast Ethernet, Jae H. Baek et al., IEEE Workshop on Signal Processing Systems 2004, pp. 136-141.

(Continued)

*Primary Examiner* — Lihong Yu
(74) *Attorney, Agent, or Firm* — Rajeev Madnawat (57) ABSTRACT

A circuit for correction of a signal which is susceptible to baseline wander. The circuit includes a front-end signal processing circuit, a slicer circuit, and a summing cross-over filter circuit. The front-end signal processing circuit includes a digital processing logic circuit and is used to process an input signal by mitigating signal artifacts. The slicer circuit samples the processed input signal and, therefrom, generates a symbol output derived from the sampled processed input signal. The summing cross-over filter circuit is arranged between the front-end signal processing circuit and the slicer circuit and mitigates baseline wander in the symbol output.

20 Claims, 3 Drawing Sheets

(56) References Cited

OTHER PUBLICATIONS

A 3V Low-Power 0.25µm CMOS 100Mb/s Receiver for Fast Ethernet, Omid Shoaei et al, IEEE International Solid-State Circuits Conference 2000, Proceedings paper 18.4.
Baseline Wander Compensation Circuit for 100/1000Base-TX Application, Chen Haoqiong at al, 8th International Conference on Solid-State and Integrated Circuit Technology 2006, Proceedings pp. 2000-2002.
Integrated Linear AC-coupling Circuit for DC-Balanced and Non-Balanced Traffics, Yikui (Jen) Dong et al, IEEE International Symposium on Circuits and Systems 2007, pp. 2132-2135 (copy unavailable).
A 32 Gb/s Backplane Transceiver with On-Chip AC-Coupling and Low Latency CDR in 32 nm SOI CMOS Technology, Gautam R. Gangasani, IEEE Journal of Solid-State Circuits, vol. 49, No. 11, Nov. 2014, pp. 2474-2489 (copy unavailable).
Shang, S. et al. "A technique for DC-offset removal and carrier phase error compensation in integrated wireless receivers", Proceedings of the International Symposium on Circuits and Systems, Bangkok, pp. I-173-I-176 (2003).

\* cited by examiner

CIRCUITS FOR CORRECTION OF SIGNALS SUSCEPTIBLE TO BASELINE WANDER

Aspects of various embodiments are directed to circuitry used for correction of a signal susceptible to baseline wander, and more particularly, to circuitry for mitigating baseline wander in a transceiver system.

Various types of transceiver systems have increasing demand for signals at higher speeds. For example, demand for internet-based operations has resulting in the development of high speed Ethernet connections. In such systems, data can be transferred through the system over copper wiring and using high speed symbol processing, and physically transferred using a set of voltage pulses that represent one or more bits of data. A voltage in the set can be referred to as a symbol. For baseband transmission of the data, a receiver can detect the voltage pulses at arrival and extract the value of the symbols before transferring information to the host circuitry. Due to the arrangement of the transceivers, the symbols can be attenuated in size and distorted before reaching the other end of a link, such as the receiver. For example, due to high-pass filtering in transmission channels as caused by transformers and series capacitors, in combination with low-frequency content of the transmitted data as defined by the coding scheme, a variation in the low-frequency content in the received differential signal can occur. This is typically referred to as "baseline wander". More specifically, an incoming signal is evaluated against a baseline or a running average of the received signal. A string of symbols of identical value, such as a string of ones or zeros, can cause baseline wander or a drift in the baseline and make it more difficult for the receiver to decode the symbols correctly. The baseline wander, which can include the input signal drifting up or down due to a string of identical values, can degrade the signal margin. In circuitry having combinations of signaling type, coding scheme, and filter cut-off frequencies, baseline wander can prevent reception of the data without correcting for the baseline wander.

These and other matters have presented challenges to efficiencies of baseline wander mitigation implementations, for a variety of applications.

SUMMARY

Various example embodiments are directed to issues such as those addressed above and/or others which may become apparent from the following disclosure concerning a circuit for correction of a signal susceptible to baseline wander and, more specifically, to a summing cross-over filter circuit used to mitigate the baseline wander by restoring low-frequency content after front end processing.

In certain example embodiments, aspects of the present disclosure involve a summing cross-over filter circuit that is arranged to receive outputs of a front-end signal processing circuit and a slicer circuit, and that replaces attenuated low-frequency content after the front end-signal processing circuit is used to mitigate signal artifacts, for example, after the front of the receive path. The replacement of the low-frequency content can occur at a location in the data path such that any front-end data path offsets are cancelled. In many transceivers, the receive path is implemented digitally. Typically, an analog front-end, including various circuitry for analog signal pre-conditioning and an analog-to-digital converter are followed by a digital signal processor to perform clock and data recovery, echo-cancellation, and equalization. Baseline wander correction can be implemented as a feedback at the front end of the data path, however, a data path delay from the input to a symbol slicer can cause a delay inside the baseline wander feedback loop, which limits the compensation bandwidth.

Various example embodiments are directed to a circuit for correction of a signal which is susceptible to baseline wander. The circuit includes a front-end signal processing circuit, a slicer circuit, and a summing cross-over filter circuit. The front-end signal processing circuit includes a digital processing logic circuit and is used to process an input signal by mitigating signal artifacts. In specific embodiments, the front-end signal processing circuit can mitigate signal echo and inter-symbol interference. For example, the front-end signal processing circuit can include an echo-cancelling circuit and/or an equalization circuit. The slicer circuit samples the processed input signal, and generates a symbol output derived from the sampled input signal. The symbol output can include an estimate of the symbols of the data transmitted. To mitigate baseline wander in the symbol output, the summing cross-over filter circuit is arranged between outputs of the front-end signal processing circuit and the slicer circuit. The summing cross-over circuit can include a first circuit and a second circuit, which are used to remove low-frequency content from the signal as input to the slicer circuit, and to replace the removed low-frequency content with regenerated low-frequency content generated from a low-pass filtered version of the symbol output received from the slicer circuit.

In another specific example embodiment, the circuit comprises a front-end signal processing circuit, a slicer circuit, and a summing cross-over filter circuit. The front-end signal processing circuit includes a digital processing logic circuit, and is configured and arranged to output a processed input signal (e.g., a sample) by mitigating signal artifacts from an input signal. The slicer circuit samples the processed input signal (e.g., a sample output from an analog-to-digital converter) and, therefrom, generate a symbol output derived from the sampled processed input signal. In various embodiments, the circuit further includes an analog-to-digital converter used to digitize the input signal and output a sample. For example, the front-end signal processing circuit can include the analog-to-digital converter, placed serially before and/or after other components of the circuit. The signal input to the slicer circuit can thereby include the sample, as digitized by the analog-to-digital converter. As previously described, the summing cross-over filter circuit is arranged between the front-end signal processing circuit and the slicer circuit to mitigate baseline wander. The summing cross-over filter circuit can include a first circuit and second circuit that perform the filtering processes. The first circuit can receive the processed input signal from the front-end signal processing circuit and provide, to the slicer circuit, a high-pass filtered version of the processed input signal. The first circuit is herein sometimes interchangeably referred to as "a high-pass filter circuit." The second circuit can receive the symbol output from the output circuit and provide a low-pass filtered version of the symbol output. The second circuit is herein sometimes interchangeably referred to as "a low-pass filter circuit."

The summing cross-over filter circuit can further include a summing circuit arranged between the first circuit and the second circuit. The summing circuit provides a sum of the high-pass filtered version of the processed input signal and the low-pass filtered version of the symbol output to the slicer circuit. For example, the first circuit can provide an input to the slicer circuit that has attenuated low-frequency content, which is replaced by regenerated low-frequency content derived from the low-pass filtered version of the symbol output by the summing circuit.

Other specific embodiments are directed to methods of using the above-described circuits. For example, a method embodiment includes providing a summing cross-over filter circuit arranged between a front-end signal processing circuit and a slicer circuit of a transceiver circuit, mitigating signal artifacts from an input signal using the front-end signal processing circuit, and providing the input signal from the front-end signal processing circuit to the summing cross-over filter circuit. The summing cross-over filter circuit and the slicer circuit are used to mitigate baseline wander by providing a high-pass filtered version of the input signal, via a high-pass filter circuit, to the slicer circuit, and generating, using the slicer circuit, a symbol output derived from the high-pass filtered version of the input signal. The method can further include providing a low-pass filtered version of the symbol output to summing circuitry, and replacing low-frequency content attenuated by the high-pass filter circuit with regenerated low-frequency content using the low-pass filtered version of the symbol output.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving a circuit used to mitigate baseline wander in transmitted data. In certain implementations, aspects of the present disclosure have been shown to be beneficial when used in the context of a summing cross-over filter circuit that mitigates baseline wander. In some embodiments, the summing cross-over filter circuit corrects for the baseline wander at the input of the slicer circuit by removing low-frequency content of a signal and replacing the removed low-frequency content with regenerated frequency content resulting from a low-pass filtered version of the slicer output. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

A number of embodiments are directed to circuitry used to correct a signal susceptible to baseline wander. As previously described, baseline wander includes or refers to the variation in the received differential signal, which can be specific to the low-frequency content of the signal. Baseline wander degrades the received signal margin and can hamper reception of the data. Various types of transceiver circuitry can be susceptible to baseline wander, such as Ethernet, serializer/deserializer (SERDES) transceivers, and digital signal processing (DSP)-based transceivers. Baseline wander can be corrected using a feedback loop that subtracts the baseline wander from the input signal. In accordance with various embodiments of the present disclosure, the baseline wander is compensated for by using cross-over filters directly at the input of the slicer to remove low-frequency content from the input signal and replace the low-frequency content with regenerated low-frequency content derived from a low-pass filtered version of the slicer output. The cross-over filters perform the filtering processing after the input signal has been processed by front-end signal processing circuitry to mitigate signal artifacts, such as inter-symbol interference (ISI), signal echo, and other artifacts that are corrected for at the front of the receive path. As the baseline correction occurs after processing by the front-end signal processing circuit, a data path delay caused by the front-end signal processing circuit may not impact baseline wander feedback. Further, as compared to feedback loops that subtract the baseline wander at the front of the receive data path, high-pass corner frequencies used can be higher allowing for smaller AC-coupling capacitors and/or high-inductance chokes. By comparison, a circuit with a baseline wander feedback loop that corrects the baseline wander at the front of the receive data path has a high-pass corner frequency that is much lower than the symbol rate. This is due to the fact that when the high-pass filter corner frequency becomes high, a part of the low-frequency signaling bandwidth is eliminated and the feedback loop cannot achieve proper baseline wander correction.

The circuit, in accordance with a number of embodiments, includes a front-end signal processing circuit, a slicer circuit, and a summing cross-over filter circuit. The front-end signal processing circuit processes an input signal by mitigating signal artifacts, such as mitigating signal echo and ISI. The slicer circuit samples the processed input signal, and generates a symbol output derived from the sampled input signal. The symbol output can include an estimate of the symbols of the data transmitted. To mitigate baseline wander in the symbol output, the summing cross-over filter circuit is arranged between outputs of the front-end signal processing circuit and the slicer circuit. For example, the summing cross-over circuit can include a first circuit (e.g., a high-pass filter circuit) and a second circuit (e.g., a low-pass filter), which are used to remove low-frequency content from the signal as input to the slicer circuitry, and to replace the removed low-frequency content with regenerated low-frequency content generated from a low-pass filtered version of the symbol output.

In various example embodiments, the front-end signal processing circuit includes a digital processing logic circuit, and outputs an equalized input signal (e.g., a sample) by mitigating signal artifacts from an input signal. Typically, an analog front-end, including various circuitry for analog signal pre-conditioning and an analog-to-digital converter are followed by the front-end signal processing circuit including a digital signal processor to perform clock and data recovery, and circuitry to perform echo-cancellation and equalization. The slicer circuit samples the processed input signal (e.g., a sample output from an analog-to-digital converter) and, therefrom, generate a symbol output derived from the sampled processed input signal. In some embodiments, there is no digital signal processing in the signal path like echo-cancellation (EC) and equalization (EQ), but typically there is. The circuit and/or the front-end signal processing circuit can further include an analog-to-digital converter used to digitize the input signal and output a sample.

As previously described, the summing cross-over filter circuit is arranged between the front-end signal processing circuit and the slicer circuit to mitigate baseline wander. The summing cross-over filter circuit can include a first circuit and second circuit that perform filtering processes. The first circuit can receive the processed input signal from the front-end signal processing circuit and provides, to the slicer circuit, a high-pass filtered version of the processed input signal. The first circuit is herein sometimes referred to as "a high-pass filter circuit." The second circuit receives the symbol output from the slicer circuit and provides a low-pass filtered version of the symbol output. The second circuit is herein sometimes referred to as "a low-pass filter circuit." The first circuit can provide an input to the slicer circuit that has attenuated low-frequency content, which is replaced by regenerated low-frequency content derived from the low-pass filtered version of the symbol output. For example, the summing cross-over filter circuit can further include a summing circuit arranged between the first circuit and the second circuit that provides a sum of the high-pass filtered version of the equalized input signal and the low-pass filtered version of the symbol output from the slicer circuit.

Other specific embodiments are directed to methods of using the above-described circuits. In various embodiments, the method includes providing a summing cross-over filter circuit arranged between a front-end signal processing circuit and an slicer circuit of a transceiver circuit and mitigating signal artifacts from an input signal using the front-end signal processing circuit. The input signal is provided from the front-end signal processing circuit to the summing cross-over filter circuit. The summing cross-over filter circuit and the slicer circuit are used to mitigate baseline wander. For example, the baseline wander is mitigated by providing a high-pass filtered version of the input signal, via a high-pass filter circuit, to the slicer circuit and generating, using the slicer circuit, a symbol output derived from the high-pass filtered version of the input signal. A low-pass filtered version of the symbol output is provided to summing circuitry, and the low-frequency content attenuated by the high-pass filter circuit is replaced with regenerated low-frequency content using the low-pass filtered version of the symbol output.

Accordingly, various embodiments are directed to a circuit that mitigates baseline wander via a correction or feedback that is not at the front of the data receive path. For example, a summing cross-over filter circuit is arranged to receive outputs of a front-end signal processing circuit and a slicer circuit, and replaces attenuated low-frequency content from the input signal after the front end-signal processing circuit mitigates signal artifacts, for example, after the front of the receive data path. Further, the location of the replacement of the low-frequency content cancels or mitigate any front-end data path offsets, thereby reducing sensitivity of the baseline wander correction to data path delay.

Figure 1A:
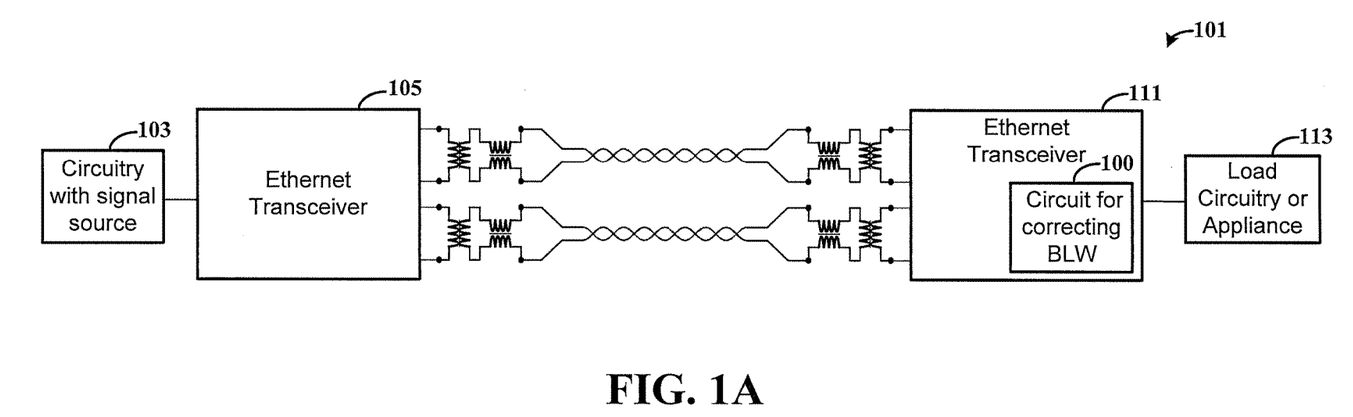
FIG. 1A is a system-level diagram illustrating an example circuit for correction of a signal, in accordance with the present disclosure.

Turning now to the figures, FIG. 1A is a system-level diagram illustrating an example circuit for correction of a signal, in accordance with the present disclosure. The system includes a transmission system 101 comprising of at two Ethernet transceivers 105, 111 which transmits data through a transmission channel. For example, the transmission channel can have one or more elements that cause high-pass transfer characteristics. As illustrated, the receiving transceiver 111 includes specialized circuitry 100 for mitigation of (e.g., correcting to an extent noticeable in the output signal) baseline wander. The transmitting transceiver 105 can receive data from circuitry with a signal source 103, which can be in the form of data, such as short or long burst of data carried by modulation of a carrier (AC) signal. The transmitting transceiver 105 can couple the modulated data into a transmission medium through one of various types of different (AC-signal impedance-based) coupler circuits configured for transferring (typically as an AC signal) the data across the medium to the transceiver 111 without significant loss of signal integrity. Such AC-signal couplers (or coupler circuits) can be implemented, for example, using capacitors, capacitor-based high-pass filtering arrangements, and inductively-based couplers, such as a transformer (each optionally also providing galvanic isolation) or conductive high pass filter without galvanic isolation as well. For example, next to AC coupling in the channel, there is regularly AC coupling applied inside the RX front-end too. Although the illustration of FIG. 1A shows a transmitter and a receiver, the transmitter and/or the receiver may be implemented as part of a transceiver configured and arranged to transmit and/or receive data. The transceiver 111 processes the input signal and outputs a data stream to load circuitry and/or an appliance 113, such as a television or other smart appliance or image or sensor data processing units in a car.

Various signal artifact can occur from the transfer of the data. Such artifacts can include inter-symbol interference (ISI) and signal echo. For example, the input signal represents a data input to a transmission channel by the transceiver 105. The transmission channel can include copper wires, twisted copper pair, and/or other transmission medium including a coaxial cable, optical fibers, and/or couplers. ISI is a form of distortion of a signal in which one symbol interferes with one or more subsequent symbols. More specifically, ISI is a result of the dispersive nature of the communication channel. As an example, many Ethernet standards, such as IEEE LAN, require systems to be capable of transmitting data through at least a 100 meter cable. Embodiments are not limited to Internet-based operations, for example, embodiments can be directed to Automotive Ethernet systems. As a result, the signal strength at the Nyquist frequency of 62.5 MHz is reduced by around 20 dB at the receiving end of the cable, which results in dispersion. When consecutive symbols are transmitted over a channel by a modulation (such as ASK, PAM, QAM, etc.), the impulse response (or equivalently the frequency response) of the channel causes a transmitted symbol to be spread in the time domain. This causes ISI because the previously transmitted symbols affect the currently received symbol, thus reducing tolerance for noise. Signal echo includes or refers to echo represented in the data, including acoustic echo and line echo. Acoustic echo can include or be associated sounds from a loudspeaker being reflected and recorded by a microphone, which can vary substantially over time. Line echo can include electrical impulses caused by, for example, coupling between the sending and receiving wires, impedance mismatches, electrical reflections, etc.

Various embodiments include a circuit 100 used for correction of a signal. The circuit 100 can include a front-end signal processing circuit, a summing cross-over filter circuit, and a slicer circuit, as further described herein. However, as may be appreciated by one of ordinary skill in the art, the circuit can include additional components. The circuit 100 can be used to mitigate baseline wander caused by the high-pass filtering in the transmission channels. As previously described, baseline wander can occur due to high-pass filtering in transmission channels as caused by transformers and series capacitors, in combination with low-frequency content of the transmitted data as defined by the coding scheme. The drift from the baseline degrades the signal margin, and in some instances can hamper reception of the data without correcting for the baseline wander.

Figure 1B:
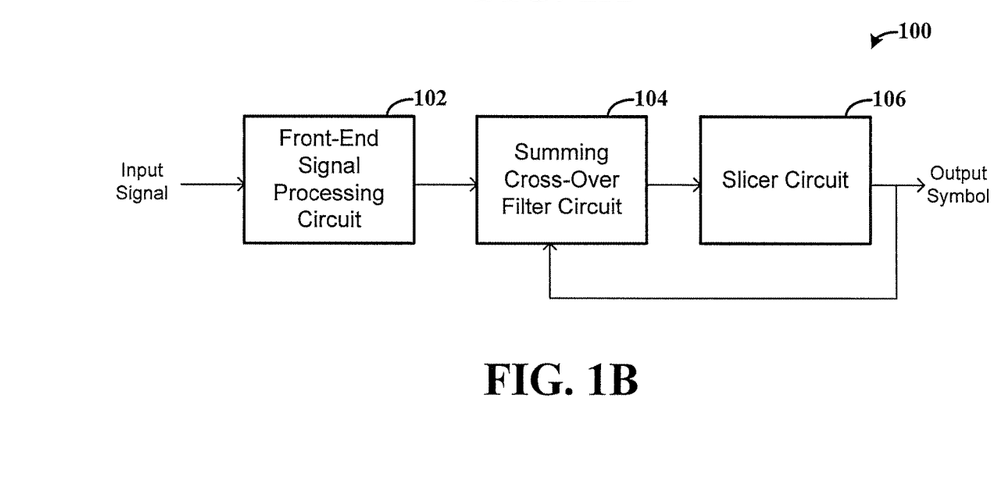
FIG. 1B is a circuit-level diagram illustrating an example circuit for correction of a signal as illustrated in FIG. 1A, in accordance with the present disclosure.

FIG. 1B is a circuit-level diagram illustrating an example circuit for correction of a signal as illustrated in FIG. 1A, in accordance with the present disclosure. Specifically, FIG. 1B illustrates an example circuit 100 used for correction of a signal susceptible to baseline wander. The circuit 100 can be part of a transceiver and/or transmission system 101 as illustrated by FIG. 1A in various embodiments. The circuit 100 includes a front-end signal processing circuit 102, a summing cross-over filter circuit 104, and a slicer circuit 106.

As illustrated, a signal is input to the circuit 100. The signal can represent a symbol stream that is input to a transmission channel by a transmitter, such as the transmitter illustrated by FIG. 1A. The symbol stream can be a variety of different symbol alphabets and/or modulations available. The input signal can have various signal artifacts. A signal artifact, as used herein, includes or refers to distortions in the signal. The signal artifacts can be caused by the transmission of the data, among other causes. The input signal is provided to the front-end signal processing circuit 102, which includes a digital signal processing circuit, to mitigate signal artifacts from the input signal and to output a processed input signal. As previously described, the digital signal processing circuit can perform clock and data recovery. In various embodiments, the front-end signal processing circuit 102 mitigates signal echo and/or ISI. For example, the front-end signal processing circuit 102 can perform normalization, echo-canceling and/or equalization on the input signal.

Although not illustrated, the circuit 100 can further include an analog-to-digital converter (ADC). The ADC can digitize the input signal and output a sample. In various embodiments, the front-end signal processing circuit 102 receives the digital output from the ADC, however embodiments are not so limited and the components of the circuit 100 can be ordered differently.

The summing cross-over filter circuit 104 is located between the front-end signal processing circuit 102 and the slicer circuit 106 and used to mitigate baseline wander. More specifically, the summing cross-over filter circuit 104 can remove low-frequency content from the processed input signal as provided by the front-end signal processing circuit 102 and replace the low-frequency content with regenerated low-frequency content from a low-pass filtered version of a symbol output from the slicer circuit 106 to mitigate baseline wander. The low-pass filter version of the symbol output can be indicative of regenerated low-frequency content. As the baseline wander is corrected for after the front-end signal processing circuit 102, the summing cross-over filter circuit 104 can mitigate sensitivity of the circuit 100 to low-frequency characteristics of transmission channels or transceiver front-ends while also cancelling or mitigating front-end data path offsets. For example, a data path delay caused by the front-end signal processing circuit 102 may not impact baseline wander feedback and/or correction as the summing cross-over filter circuit 104 corrects for the baseline wander at the input of the slicer circuit 106 using the output of the slicer circuit 106.

The slicer circuit 106 samples the processed input signal and, therefrom, generates a symbol output derived from the sampled processed input signal. For example, the slicer circuit 106 can generate estimated values of symbols derived from the sample and provide the symbol output indicative of the estimated values. The input to the slicer circuit 106 includes a high-pass filtered version of the processed input circuit having low-frequency content attenuated. In specific embodiments, the attenuated low frequency content is replaced by regenerated low-frequency content using a low-pass filtered version of the symbol output.

The summing cross-over filter circuit 104 can include a plurality of circuit components. In various embodiments, the summing cross-over filter circuit 104 includes a first circuit that performs a high-pass filtering process and a second circuit that performs a low-pass filtering process. The first circuit, which can also be referred to as "a high-pass filter circuit", receives the processed input signal from the front-end signal processing circuit 102 and provides a high-pass output that includes portions of the processed input signal having frequency content above a first threshold. For example, the first circuit attenuates low-frequency content from the processed input signal and outputs the same to the slicer circuit 106. The second circuit, which can also be referred to as a "low-pass filter circuit", receives the symbol output from the slicer circuit 106 and, therefrom, provides a low-pass output that includes portions of the symbol output having frequency content below a second threshold. For example, the second circuit attenuates high-frequency content from the symbol output of the slicer circuit 106.

The summing cross-over filter circuit 104 can additionally include a summing circuit. The summing circuit is arranged to receive the outputs of the first circuit and the second circuit, and to provide a sum of the outputs to the slicer circuit 106. For example, the summing circuit outputs a sum of the high-pass output and the low-pass output to the slicer circuit 106. The summing circuit can replace the low-frequency content that is missing at the output of the first circuit, as attenuated by the first circuit, is replaced with the regenerated low-frequency content derived from the low-pass output of the symbol output from the slicer circuit 106. The summing cross-over filter circuit 104 thereby corrects for baseline wander at the input of the slicer circuit 106.

Although the embodiments of FIGS. 1A and 1B illustrate various circuitry in a particular configuration, one of ordinary skill in the art may appreciate that the circuit 100 and/or the system 101 can include additional circuitry and/or components and/or can be in different orders. As an example, the circuit 100 can include an ADC, and/or other types of equalization circuits. Further, the transmitter can include a circuit 100 as illustrated by FIG. 1B and/or a similar type of circuit.

Figure 2A:
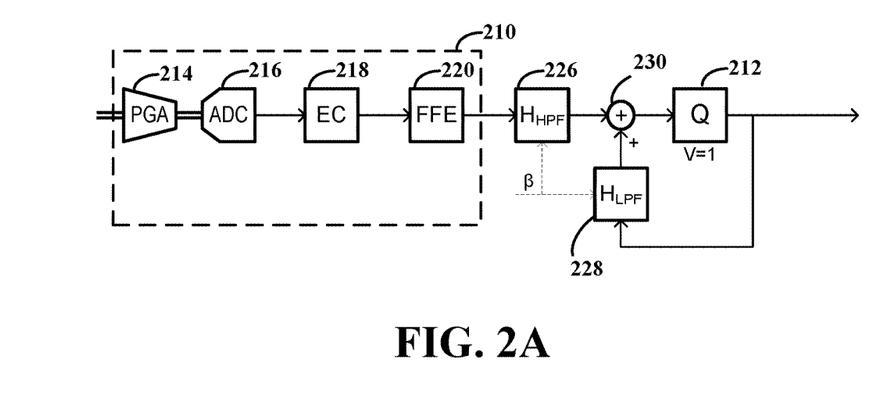
FIGS. 2A-2B illustrates examples of circuits for correction of a signal, in accordance with the present disclosure.
Figure 2B:
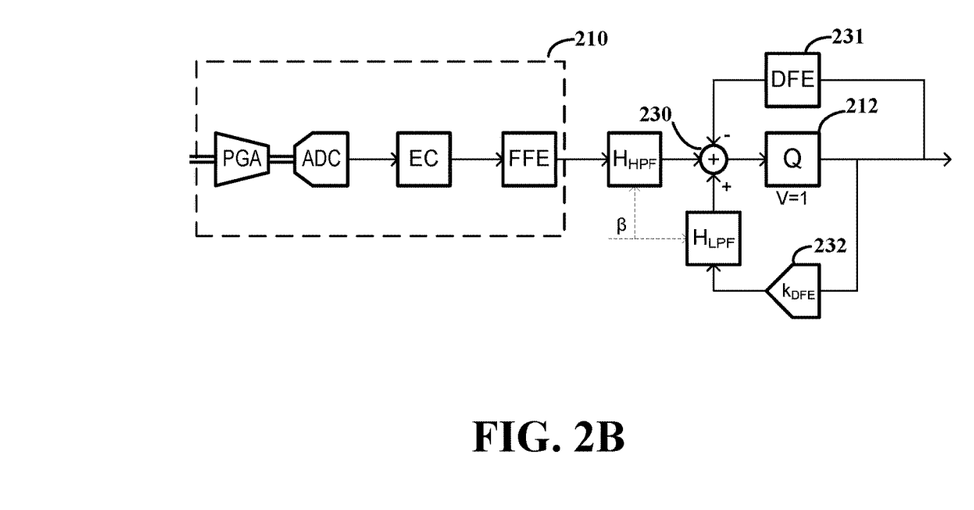

FIGS. 2A-2B illustrates examples of circuits for correction of a signal, in accordance with the present disclosure. The circuit, in various embodiments, can include a decision feedback equalizer, as illustrated by FIG. 2B, or not, as illustrated by FIG. 2A.

FIG. 2A illustrates an example of a circuit for correction of a signal which is susceptible to baseline wander. The circuit includes a front-end signal processing circuit 210, a slicer circuit 212, and a summing cross-over filter circuit 226, 228, 230, as previously described. The circuit can be a part of a transceiver that can perform echo-cancelling, feed-forward equalization, and baseline wander correction.

The front-end signal processing circuit 210 can include a variety of components. For example, the front-end signal processing circuit 210 can include a programmable gain amp (PGA) 214, an ADC 216, an echo-cancelling circuit (EC) 218, and an equalization circuit, such as a feed-forward equalization circuit (FFE) 220. One skilled in the art will recognize that the various components of the front-end signal processing circuit 210 can be arranged in a different order, for example, the EC 218 can be sequentially after the FFE 220.

In various specific embodiments, an input signal is received conductively or via an AC-signal impedance-based circuit (which is not shown), however embodiments are not so limited. The input signal can be received a variety of different ways, such as magnetically, acoustically, or via any other transmission channel which is filtering out (a part of the) low-frequency content of the system stream. For example, the input signal can be received via AC-coupled communication channels. The PGA 214 provides a gain to the input signal and outputs the input signal with the gain to the ADC 216. The PGA 214 can be a digital amplifier or an analog amplifier that is used to provide a gain and can be used to compensate for loss of the signal that is caused by transmission. The ADC 216 then digitizes the input signal and outputs a sample. For example, the ADC 216 samples and holds the input signal for a duration of the symbol period.

The digitized version of the input signal, e.g., the sample, is input to the EC 218 and/or an equalization circuit, such as the FFE 220. The EC 218 can mitigate signal echo from the input signal and provide the input signal to the equalization circuit. The equalization circuit mitigates ISI from the input signal and provides the processed input signal to the summing cross-over filter circuit 226, 228, 230.

The summing cross-over filter circuit 226, 228, 230 includes cross-over filters directly at the input of the slicer circuit 212 used to remove low-frequency content from the processed input signal and replace the removed low-frequency content with regenerated content resulting from the low-pass filtered version of the slicer output. As illustrated, the summing cross-over filter circuit is arranged between the front-end signal processing circuit 210 and the slicer circuit 212, and includes a first circuit 226 and a second circuit 228. The summing cross-over filter circuit can further include a summing circuit 230 arranged to receive outputs from both the first circuit 226 and the second circuit 228.

The first circuit 226 can perform a high-pass filter process on the processed input signal. For example, the first circuit 226 receives the processed input signal from the front-end signal processing circuit 210 and provides, to the slicer circuit 212, a high-pass filtered version of the processed input signal. The first circuit 226 provides an output to the summing circuit 230 that includes portions of the processed input signal having a frequency above a first threshold. The first circuit 226 thereby attenuates the low-frequency content of the processed input signal. The output by the first circuit 226 can be interchangeably referred to as a "high-pass output".

The second circuit 228 performs a low-pass filter process on the symbol output from the slicer circuit 212. For example, the second circuit 228 receives the symbol output from the slicer circuit 212 and provides a low-pass filtered version of the symbol output. The second circuit 228 provides an output to the summing circuit 230 that includes portions of the symbol output having a frequency below a second threshold. The output by the second circuit 228 can be interchangeably referred to as a "low-pass output".

The low-pass output by the second circuit 228 can be indicative of or include regenerated low-frequency content and is used to replace the attenuated low-frequency content. For example, the summing cross-over filter circuit can compensate for baseline wander by replacing the attenuated low-frequency content, as attenuated by the first circuit 226, with the regenerated low-frequency content derived from the low-pass filtered version of the symbol output, and while being insensitive to data path delays from the front-end signal processing circuit 210.

The summing circuit 230, which is arranged between the first circuit 226 and the second circuit 228, can receive the high-pass filtered version of the processed input signal and the low-pass filtered version of the symbol output, and provide a sum of the same to the slicer circuit 212. The corner frequencies of the transfer functions of the first circuit 226 and the second circuit 228 can track, such that the sum of the transfer function of the high-pass filtering process and the transfer function of the low-pass filtering process approximate unity, and the low-frequency content attenuated by the first circuit 226 is replaced with the regenerated low-frequency content.

In various specific embodiments, the first circuit 226 is or includes a high-pass filter circuit and the second circuit 228 is or includes a low-pass filter circuit. Further, the filters can include cross-over filter of any order. For example, higher-order filters can be used to realize a narrower cross-over band as compared to first-order filters. In other embodiments, first-order cross-over filters can be used which can be implemented with complementary infinite impulse response (IIR) filters that share the same frequency corners, which is further illustrated herein by FIGS. 3A-3B and 4A-4B. However, embodiments are not limited to the example filter illustrated and can include a variety of filters and filter-orders. For example, the first circuit 226 can implement a band-pass filter and the second circuit 228 can implement a band-stop filter. As can be appreciated by ordinary skill, a band-pass filter can allow frequency content between a range (e.g., between X and Y) to pass and a band-stop filter can attenuate frequency content between the range (e.g., attenuate between X and Y).

The summing circuit 230 provides the sum to the slicer circuit 212. As previously described, the slicer circuit 212 samples the processed input signal and, therefrom, generates a symbol output derived from the sampled processed input signal. The symbol output includes an estimate of symbols during a sample period of time. The structure and operation of slicer circuit 212 can depend on the symbol modulation of the receiver.

FIG. 2B illustrates an example of a circuit, as illustrated by FIG. 2A, with the addition of a decision feedback equalization circuit (DFE) 231. The circuit includes the front-end signal processing circuit 210, a slicer circuit 212, and a summing cross-over filter circuit, including the first circuit, second circuit, and summing circuit 230, as previously described above in connection with FIG. 2A. The circuit additionally includes a DFE 231 that provides feedback to the summing circuit 230. The feedback provided is derived from the symbol output from the slicer circuit. A DFE, as may be appreciated by one of ordinary skill, is filter that uses scaled feedback of previous symbols to cancel post-cursor ISI. The output from the DFE 231 can be subtracted from the output of the FFE 220.

With the addition of the DFE 231, a gain compensation circuit 232 is added in the pathway (e.g., the feedback path) to the second circuit. The gain compensation circuit 232 adds a gain to the feedback used to correct for baseline wander.

Although the embodiments of FIGS. 2A-2B illustrate an ADC, embodiments are not so limited. For example, various embodiments can include an analog circuit, which may not include an ADC, and/or may include a digital-to analog circuit (DAC). Furthermore, embodiments are not limited to an FFE as illustrated and the equalization circuit can include various types of equalizer structure. Additionally, the baseline wander correction, as illustrated by the various circuitry herein, can be used in combination with other known baseline correction techniques, such as using the above approach in addition to a feedback path used to correct the baseline wander at the front of the data path (e.g., at the output the ADC and/or before the ADC). For more general and specific information relating to correcting the baseline wander at the front of the data path (as well as related to aspects of the equations further illustrated by FIG. 3C), reference is made to: Jae H. Baek, et al., "Efficient Digital Baseline Wander Algorithm and It's Architecture for Fast Ethernet", IEEE Workshop on Signal Processing Systems 2004, pages 136-141; Omid Shoaei et al, "A 3V Low-Power 0.25 μm CMOS 100 Mb/s Receiver for Fast Ethernet", IEEE International Solid-State Circuits Conference 2000, Proceedings paper 18.4; and Chen Haoqiong, et al, "Baseline Wander Compensation Circuit for 100/1000Base-TX Application", 8th International Conference on Solid-State and Integrated Circuit Technology 2006, Proceedings pages 2000-2002, each of which are fully incorporated for their teachings. Combining the feedback approaches can be used to condition the input signal dynamic range and reduce cross-over filter specs. As described above, the cross-over filter solution is not hampered by data path delay and can allow for smaller baseline wander residue at the slicer circuit input.

Figure 3A:
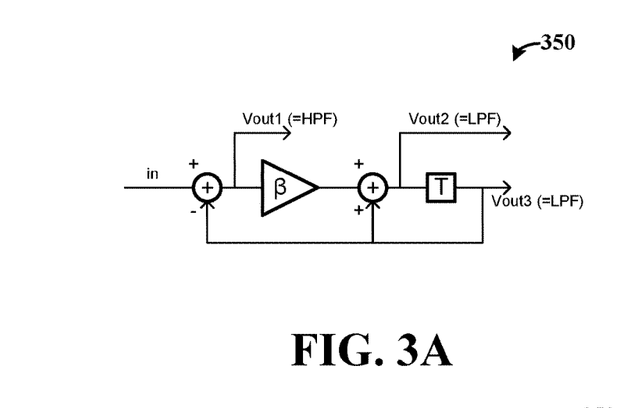
FIGS. 3A-3C illustrate an example of at least portions of a summing cross-over filter circuit and a transfer function corresponding to the filter process.
Figure 3B:
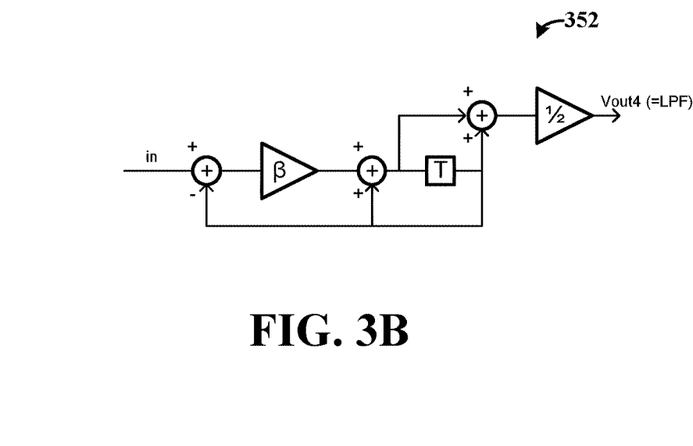
Figure 3C:
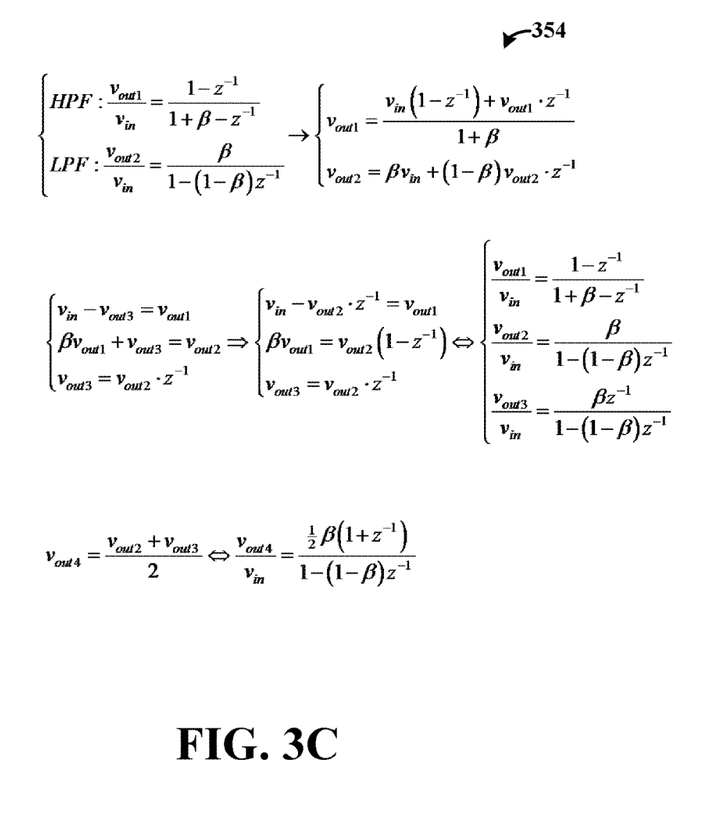

FIGS. 3A-3C illustrate an example of at least portions of a summing cross-over filter circuit and a transfer function corresponding to the filter process. More specifically, FIGS. 3A and 3B illustrate example first circuit and second circuitry 350, 352 used to implement first-order IIR high-pass filtering (HPF) and IIR low-pass filtering (LPF) transfer functions. FIG. 3C illustrates example equations 354 of the IIR HPF and IIR LPF transfer functions. However, embodiments are not limited to first-order filters and can include higher-order filters. Further, embodiments are not limited to the transfer functions as illustrated.

As may be appreciated by one of ordinary skill in the art, FIG. 3C illustrates example equations 354 that describe the transfer functions in the z-domain. The variable beta in the example equations 354 can set the cross-over frequency of these first-order filters. The relationship between beta and the cross-over frequency $f_c$ can be given by:

$$\beta = \frac{T}{\tau}\left(1 - \frac{T}{2\tau}\right) \Leftrightarrow \frac{T}{\tau} = 1 \pm \sqrt{1 - 2\beta}$$

$$f_c = \frac{f_s}{2\pi}\left(1 - \sqrt{1 - 2\beta}\right)$$

With fs being the sample frequency of the filter.

In various related embodiments, the above illustrated circuitry can be used in a method for mitigating baseline wander in a signal. The method can include providing a summing cross-over filter circuit arranged between a front-end signal processing circuit, including a digital processing logic circuit, and an slicer circuit of a transceiver circuit, and mitigating signal artifacts from an input signal using the front-end signal processing circuit. The input signal is then provided from the front-end signal processing circuit to the summing cross-over filter circuit and baseline wander is mitigated from the input signal using the summing cross-over filter circuit and the slicer circuit. For example, the baseline wander can be mitigated by providing a high-pass filtered version of the input signal, via a high-pass filter circuit, to the slicer circuit, generating, using the slicer circuit, a symbol output derived from the high-pass filtered version of the input signal, providing a low-pass filtered version of the symbol output to summing circuitry, and replacing low-frequency content attenuated by the high-pass path of the high-pass filter circuit with regenerated low-frequency content using the low-pass filtered version of the symbol output.

Terms to exemplify orientation, such as front of the receive path, before or after, upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, circuit, and/or other circuit-type depictions (e.g., reference numerals 102 and 210 of FIGS. 1B and 2A depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIG. 3C. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry", "filters" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the transfer functions illustrated by FIG. 3C can be carried out using the circuitry illustrated by FIGS. 1A-1B and FIGS. 2A-2B. As another example, the circuit illustrated by FIG. 1B can include components illustrated by FIGS. 2A-2B and/or FIGS. 3A-3B. Similarly, the circuits illustrated by FIGS. 2B-2B can include components illustrated by FIGS. 3A-3B. Such modifications do not depart from the true spirit and scope of various aspects of the disclosure, including aspects set forth in the claims.

What is claimed is:

1. A circuit for correction of a signal which is susceptible to baseline wander, the circuit comprising:
    a front-end signal processing circuit, including a digital processing logic circuit, configured and arranged to process an input signal by mitigating signal artifacts;
    a slicer circuit configured and arranged to sample the processed input signal and, therefrom, generate a symbol output derived from the sampled processed input signal;
    a summing cross-over filter circuit configured and arranged between the front-end signal processing circuit and the slicer circuit to mitigate baseline wander in the symbol output; and
    a decision feedback equalization (DFE) circuit coupled to the output of the slicer and the summing cross-over filter circuit to provide scaled feedback of previous symbols to the summing cross-over filter circuit.

2. The circuit of claim 1, wherein the summing cross-over filter circuit, including a high-pass filter circuit and a low-pass filter circuit, is configured and arranged to remove and replace low-frequency content from the processed input signal with regenerated low-frequency content generated from a low-pass filtered version of the symbol output.

3. The circuit of claim 1, wherein the summing cross-over filter circuit is configured and arranged to mitigate sensitivity of the circuit to low-frequency characteristics of transmission channels or transceiver front-ends.

4. The circuit of claim 1, wherein the summing cross-over filter circuit includes:

a first circuit configured and arranged to perform a high-pass filtering process including receiving the processed input signal from the front-end signal processing circuit and providing a high-pass output that includes portions of the processed input signal having frequency content above a first threshold;
    a second circuit configured and arranged to perform a low-pass filtering process including receiving the symbol output from the slicer circuit and, therefrom, providing a low-pass output that includes portions of the symbol output having frequency content below a second threshold; and
    a summing circuit configured and arranged to output a sum of the high-pass output and the low-pass output to the slicer circuit.

5. The circuit of claim 4, wherein corner frequencies of transfer functions of the first circuit and the second circuit track, such that the sum of the transfer functions approximate unity.

6. The circuit of claim 4, wherein the DFE configured and arranged to provide feedback to the summing circuit derived from the symbol output, and including a gain compensation circuit configured and arranged in a pathway of the second circuit.

7. The circuit of claim 1, wherein the front-end signal processing circuit configured and arranged to mitigate signal artifacts from the input signal includes mitigating signal echo and inter-symbol interference.

8. The circuit of claim 1, wherein the front-end signal processing circuit configured and arranged to mitigate signal artifacts from the input signal includes performing normalization, echo-canceling and equalization on the input signal.

9. The circuit of claim 1, wherein the front-end signal processing circuit includes an echo-cancelling circuit configured and arranged to mitigate signal echo from the input signal.

10. The circuit of claim 1, wherein the front-end signal processing circuit includes an equalization circuit configured and arranged to mitigate inter-symbol interference from the input signal.

11. The circuit of claim 1, further including an alternating current impedance circuit configured and arranged to receive the input signal conductively, capacitively, magnetically or acoustically.

12. The circuit of claim 1, further including an analog-to-digital converter configured and arranged to digitize the input signal and output a sample, wherein the slicer circuit is configured and arranged to generate estimated values of symbols, and provide the symbol output indicative of the estimated values.

13. A circuit comprising:
    a frontend signal processing circuit, including a digital processing logic circuit, configured and arranged to output a processed input signal by mitigating signal artifacts from an input signal;
    a slicer circuit configured and arranged to sample the processed input signal and, therefrom, generate a symbol output derived from the sampled processed input signal;
    a summing crossover filter circuit configured and arranged between the frontend signal processing circuit and the slicer circuit to mitigate baseline wander, the summing crossover filter circuit including:
        a first circuit configured and arranged to receive the processed input signal from the frontend signal processing circuit and provide, to the slicer circuit, a highpass filtered version of the processed input signal having lowfrequency content attenuated;

a second circuit configured and arranged to receive the symbol output from the slicer circuit and provide a lowpass filtered version of the symbol output that is indicative of regenerated lowfrequency content to replace the attenuated low-frequency content; and a decision feedback equalization (DFE) circuit coupled to the output of the slicer and the summing cross-over filter circuit to provide scaled feedback of previous symbols to the summing cross-over filter circuit.

14. The circuit of claim 13, wherein the summing cross-over filter circuit is configured and arranged to compensate for baseline wander by replacing attenuated low-frequency content, as attenuated by the first circuit and a channel, with the regenerated low-frequency content derived from the low-pass filtered version of the symbol output, and while being insensitive to data path delays from the front-end signal processing circuit.

15. The circuit of claim 13, wherein the summing cross-over filter circuit further includes a summing circuit configured and arranged between the first circuit and the second circuit, wherein the second circuit is configured and arranged to provide the low-pass filtered version of the symbol output, which is indicative of regenerated low-frequency content, to the summing circuit by attenuating frequency components above a threshold from the symbol output.

16. The circuit of claim 15, wherein the summing circuit is configured and arranged to provide a sum of the high-pass filtered version of the processed input signal and the low-pass filtered version of the symbol output to the slicer circuit, wherein a sum of a transfer function of the high-pass filtering process and a transfer function of the low-pass filtering process approximate unity, such that the low-frequency content that is missing at the output of the first circuit, as attenuated by the first circuit, is replaced with the regenerated low-frequency content.

17. The circuit of claim 13, wherein the first circuit is a high-pass filter and the second circuit is a low-pass filter, both the first and second circuits include first-order cross-over filters.

18. The circuit of claim 13, wherein the first circuit and second circuit include cross-over filters of an order greater than one.

19. A method comprising:
providing a summing cross-over filter circuit configured and arranged between a front-end signal processing circuit, including a digital processing logic circuit, and a slicer circuit of a transceiver circuit;

mitigating signal artifacts from an input signal using the frontend signal processing circuit;

providing the input signal from the front-end signal processing circuit to the summing cross-over filter circuit;

mitigating baseline wander from the input signal using the summing crossover filter circuit and the slicer circuit including:

providing a highpass filtered version of the input signal, via a highpass filter circuit, to the slicer circuit;

generating, using the slicer circuit, a symbol ouput derived from the high-pass filtered version of the input signal;

providing a lowpass filtered version of the symbol output to summing circuitry;

replacing missing low-frequency content as attenuated by the high-pass path of the high-pass filter circuit with regenerated low-frequency content using the low-pass filtered version of the symbol ouput; and providing a scaled feedback of previous symbols from an output of the slicer circuit using a decision feedback equalization (DFE) circuit coupled to the output of the slicer and the summing cross-over filter circuit.

20. The method of claim 19, further including receiving the input signal via alternating current (AC)-coupled communication channels.

\* \* \* \* \*